(12) United States Patent
Li et al.

(10) Patent No.: US 12,580,019 B2
(45) Date of Patent: Mar. 17, 2026

(54) SEMICONDUCTOR DEVICE AND FABRICATION METHOD THEREOF

(71) Applicant: Yangtze Memory Technologies Co., Ltd., Wuhan (CN)

(72) Inventors: Hanxiao Li, Wuhan (CN); Jinxing Chen, Wuhan (CN); Guanglong Fan, Wuhan (CN); Yanli Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 511 days.

(21) Appl. No.: 18/090,113

(22) Filed: Dec. 28, 2022

(65) Prior Publication Data

US 2024/0203493 A1     Jun. 20, 2024

(30) Foreign Application Priority Data

Dec. 14, 2022     (CN) .......................... 202211608322.5

(51) Int. Cl.
| | |
|---|---|
| *G11C 16/04* | (2006.01) |
| *H01L 23/522* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC ...... *G11C 16/0483* (2013.01); *H01L 23/5226* (2013.01); *H10B 41/10* (2023.02); *H10B 41/27* (2023.02); *H10B 41/35* (2023.02);
*H10B 43/10* (2023.02); *H10B 43/27* (2023.02); *H10B 43/35* (2023.02)

(58) Field of Classification Search
CPC . G11C 16/0483; H01L 23/5226; H10B 41/10; H10B 41/27; H10B 41/35; H10B 43/10; H10B 43/27; H10B 43/35; H10B 43/40
See application file for complete search history.

(56) References Cited

U.S. PATENT DOCUMENTS

| | | | |
|---|---|---|---|
| 2007/0205438 A1* | 9/2007 | Juengling .............. | H10D 84/83 |
| | | | 257/E21.655 |
| 2009/0108248 A1* | 4/2009 | Klostermann ......... | H10B 61/22 |
| | | | 438/102 |
| 2019/0081069 A1* | 3/2019 | Lu .......................... | H10D 88/00 |

FOREIGN PATENT DOCUMENTS

| | | | | |
|---|---|---|---|---|
| JP | 2012146861 A | * | 8/2012 | ......... H01L 27/0688 |

* cited by examiner

*Primary Examiner* — Ermias T Woldegeorgis
(74) *Attorney, Agent, or Firm* — Anova Law Group, PLLC

(57)     ABSTRACT

A semiconductor device includes a memory cell wafer. The memory cell wafer includes a dielectric layer, a conductor layer over the dielectric layer, one or more through contacts penetrating through the dielectric layer and the conductor layer, and an isolator surrounding a region of the conductor layer and at least one of the one or more through contacts in a horizontal direction and extending vertically through the conductor layer to be connected to the dielectric layer. The region of the conductor layer surrounded by the isolator is isolated from other portions of the conductor layer. Each of the one or more through contacts includes a column part in the dielectric layer and a pad part in the conductor layer.

20 Claims, 19 Drawing Sheets

140

102

126

B ⎯ ⎯ ⎯ ⎯ B'

102

126

120

140

500

600

700

SEMICONDUCTOR DEVICE AND FABRICATION METHOD THEREOF

CROSS-REFERENCE TO RELATED APPLICATION

This application claims the priority of Chinese Patent Application No. 202211608322.5, filed on Dec. 14, 2022, the content of which is incorporated herein by reference in its entirety.

FIELD OF THE TECHNOLOGY

This application relates to the field of semiconductor technology and, more particularly, to a semiconductor device and fabrication method thereof.

BACKGROUND OF THE DISCLOSURE

Three-dimensional (3D) memory devices, such as 3D NAND memory devices, are promising memory devices with the potential of having a much higher storage density than conventional planar memories, and can meet the growing demands of consumer electronics, cloud computing, and big data for larger capacity and better performance. A 3D memory device usually includes multiple stack layers in a single chip to achieve a higher density, a higher capacity, a faster performance, a lower power consumption, and a better cost efficiency.

SUMMARY

In accordance with the disclosure, there is provided a semiconductor device including a memory cell wafer. The memory cell wafer includes a dielectric layer, a conductor layer over the dielectric layer, one or more through contacts penetrating through the dielectric layer and the conductor layer, and an isolator surrounding a region of the conductor layer and at least one of the one or more through contacts in a horizontal direction and extending vertically through the conductor layer to be connected to the dielectric layer. The region of the conductor layer surrounded by the isolator is isolated from other portions of the conductor layer. Each of the one or more through contacts includes a column part in the dielectric layer and a pad part in the conductor layer.

Also in accordance with the disclosure, there is provided a semiconductor device fabrication method including providing a starting wafer. The starting wafer includes a substrate, a sacrificial layer formed over the substrate, and a conductor layer formed over the sacrificial layer. The method further includes patterning the conductor layer to form a trench in the conductor layer. The trench isolates a region of the conductor layer surrounded by the trench from other portions of the conductor layer. The method also includes filling an insulation material in the trench to form an isolator.

Also in accordance with the disclosure, there is provided a memory system including a memory device and a memory controller configured to control operation of the memory device. The memory device includes a memory cell wafer. The memory cell wafer includes a dielectric layer, a conductor layer over the dielectric layer, one or more through contacts penetrating through the dielectric layer and the conductor layer, and an isolator surrounding a region of the conductor layer and at least one of the one or more through contacts in a horizontal direction and extending vertically through the conductor layer to be connected to the dielectric layer. The region of the conductor layer surrounded by the isolator is isolated from other portions of the conductor layer. Each of the one or more through contacts includes a column part in the dielectric layer and a pad part in the conductor layer.

DESCRIPTION OF EMBODIMENTS

Figure 1A:
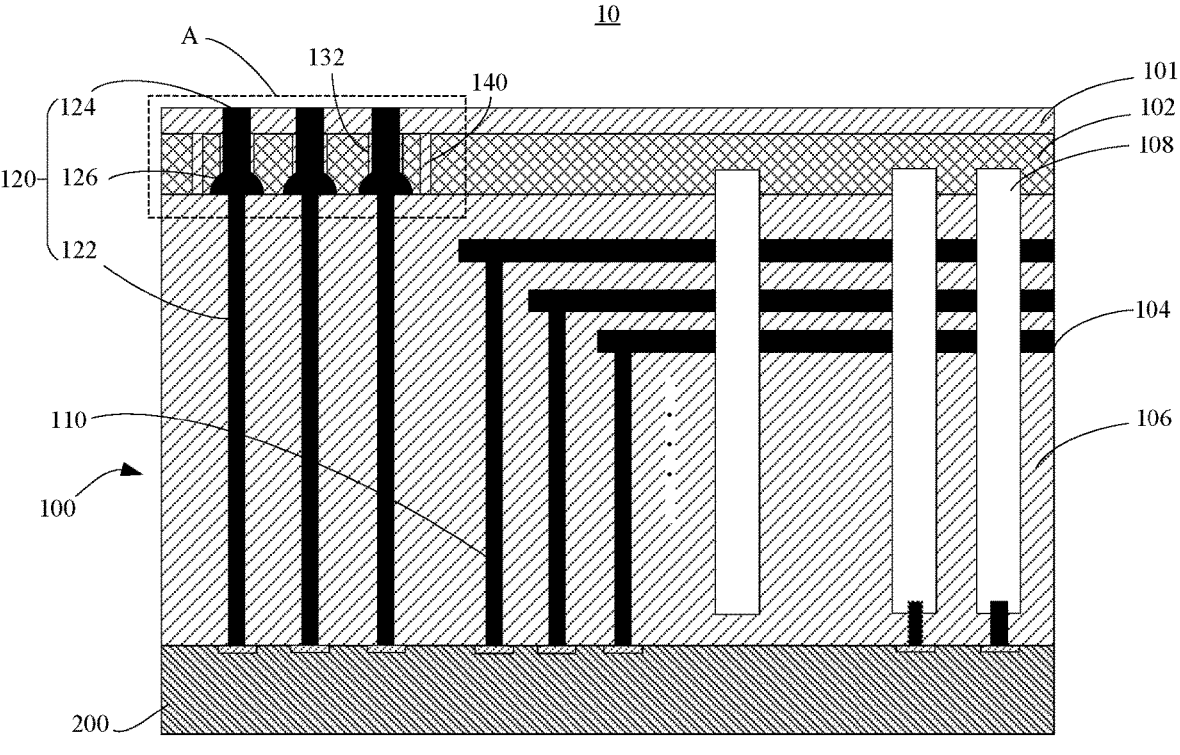
FIG. 1A is a vertical cross-sectional view schematically showing a portion of an example semiconductor device consistent with the disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

References in the specification to "one embodiment," "an embodiment," "an exemplary embodiment," "some embodiments," etc., indicate that the embodiment described may include a particular feature, structure, or characteristic, but not every embodiment necessarily includes the particular feature, structure, or characteristic. Moreover, such phrases do not necessarily refer to the same embodiment.

Further, when a particular feature, structure or characteristic is described in connection with an embodiment, it would be within the knowledge of a person skilled in the art to affect such feature, structure or characteristic in connection with other embodiments whether or not explicitly described. A person of ordinary skill in the art can make modifications to the described embodiments according to the principle of the present disclosure. For example, one or more components of the disclosed device can be omitted or one or more components not explicitly described above can be added to the device. Similarly, one or more steps in the disclosed method can be omitted or one or more steps not explicitly described above can be included in the method.

Unless otherwise defined, all technical and scientific terms used in this disclosure have the same or similar meanings as generally understood by those having ordinary skill in the art. As described herein, the terms used in the specification of the present disclosure are intended to describe example embodiments, instead of limiting the present disclosure. In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," may be understood to convey a singular usage or to convey a plural usage, depending at least in part upon context.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "vertical," "horizontal," "up," "down," "left," "right," "perpendicular," "parallel," and similar expressions used herein, are merely intended for purposes of description. For example, phrases indicating directions, such as "vertical," "horizontal," "up," "down," "left," and "right," are to be understood as indicating the directions in the drawings with the orientation shown therein. The term "and/or" used herein includes any suitable combination of one or more related items listed.

In this disclosure, a value or a range of values may refer to a desired, target, or nominal value or range of values and can include slight variations. The term "about" or "approximately" associated with a value can allow a variation within, for example, 10% of the value, such as ±2%, ±5%, or ±10% of the value, or another proper variation as appreciated by those having ordinary skill in the art. The term "about" or "approximately" associated with a state can allow a slight deviation from the state. For example, a first component being approximately perpendicular to a second component can indicate that the first component is either exactly perpendicular to the second component or slightly deviates from being perpendicular to the second component, and an angle between the first and second components can be within a range from, e.g., 80° to 100°, or another proper range as appreciated by those having ordinary skill in the art.

FIG. 1A is a cross-sectional view (vertical cross-sectional view) schematically showing a portion of an example semiconductor device 10 consistent with the disclosure. The semiconductor device 10 includes a memory cell wafer 100 (also referred to as a "memory array wafer," an "array wafer," or a "first wafer") having various memory structures bonded to a control circuit wafer 200 (also referred to as a "control wafer," a "circuit wafer," a "peripheral circuit wafer," or a "second wafer"). The various memory structures can be formed by, for example, deposition, photolithography, implantation, etching, etc. In this disclosure, a memory structure refers to a structure or a component that constitutes a part of a memory device, and can be, e.g., as simple as a single layer, or a structure or composite layer formed by multiple layers of same/different materials having same/similar/different properties.

As shown in FIG. 1A, the memory cell wafer 100 includes an insulation layer 101 and a first conductor layer 102 stacked one on another. The insulation layer 101 can be formed of one or more dielectric materials, such as one or more of silicon oxide, silicon nitride, and silicon oxynitride. The first conductor layer 102 can be, for example, a top conductor layer, and can include, for example, polycrystalline silicon (polysilicon). The memory cell wafer 100 further includes a plurality of conductor layers 104 (also referred to as "tier conductor layer" or "gate conductor layers") buried in a dielectric layer 106, and the plurality of conductor layers 104 and the dielectric layer 106 are sandwiched between the first conductor layer 102 and the control circuit wafer 200. As shown in FIG. 1A, the conductor layers 104 extend horizontally and, in a certain region of the memory cell wafer 100, are formed in a way that they become shorter one after another in a direction away from the first conductor layer 102, forming a staircase-like structure (SS structure). In this disclosure, "horizontal" can refer to a direction parallel to a surface of the memory cell wafer 100, and "vertical" can refer to a direction perpendicular to the surface of the memory cell wafer 100. The conductor layers 104 can be formed of one or more conductor materials, such as one or more of tungsten (W), cobalt (Co), copper (Cu), aluminum (Al), doped silicon (polysilicon), and silicides. The dielectric layer 106 can include one or more dielectric sublayers and can be formed of one or more dielectric materials, such as one or more of silicon oxide, silicon nitride, and silicon oxynitride.

As shown in FIG. 1A, the memory cell wafer 100 further includes a plurality of memory strings 108 (also referred to as "memory cell strings") each including a plurality of memory cells arranged one after another in the vertical direction. Each memory string 108 can be electrically coupled to a control device (such as a transistor) in the control circuit wafer 200. For a NAND type memory device, the memory string 108 can be a NAND string.

Each memory string 108 can include a channel hole (CH) filled with suitable material(s) to form suitable layers, such as a channel layer and a memory film surrounding the channel layer. For simplicity of description, in this disclosure, a CH filled with material(s) is also referred to as a CH. The channel layer can include a semiconductor material, such as silicon (e.g., amorphous silicon, polycrystalline silicon, or single crystalline silicon), and can be doped with a suitable dopant. The memory film is configured to store data by, for example, storing electric charges, such as electrons. The memory film can be formed of one or more suitable materials such as one or more of silicon nitride, silicon oxide, silicon oxynitride, silicon, high dielectric constant (high-k) materials, polysilicon, and single crystalline silicon. In some embodiments, the memory film can include a composite layer structure including a tunneling layer, a storage layer (also referred to as a "charge trap/storage layer"), and a blocking layer arranged in this order from a side of the memory film proximal to the channel layer toward a side proximal to the conductor layers 104. The tunneling layer, the storage layer, and the blocking layer can be formed of a same dielectric material or different dielectric materials. For example, the tunneling layer can include at least one of silicon oxide or silicon nitride, the storage layer can include at least one of silicon nitride, silicon oxynitride, or silicon, and the blocking layer can include at least one of silicon oxide, silicon nitride, or a high-k material. As an example, the memory film can have an ONO (silicon oxide/ silicon nitride/silicon oxide) structure, with the silicon nitride layer being the storage layer.

A portion of a conductor layer 104 close to a CH, together with a corresponding portion of the memory film and a corresponding portion of the channel layer of the CH that are close to that portion of the conductor layer 104, form a memory cell of the memory string. In this memory cell, the portion of the conductor layer 104 can function as a gate, such as a control gate.

The memory cell wafer 100 further includes a plurality of through array contacts 110 (TACs) that extend in the vertical direction. Each of the plurality of TACs 110 can electrically couple one conductor layer 104, and hence a plurality of memory cells connected by the one conductor layer 104, to a control device (such as a transistor) in the control circuit wafer 200. Since the plurality of memory cells coupled by a same TAC 110 to the control device in the control circuit wafer 200 are arranged in a word line direction of the semiconductor device 10, the TAC 110 is also referred to as a "word line contact." The TACs 110 can be formed of one or more conductor materials, such as one or more of W, Co, Cu, Al, polysilicon, and silicides.

As shown in FIG. 1A, the memory cell wafer 100 further includes a plurality of through silicon contacts (TSCs) 120 penetrating through the insulation layer 101, the first conductor layer 102, and the dielectric layer 106, and reaching the control circuit wafer 200. In this disclosure, the TSC 120 is also referred to as a "first through contact" and the TAC 110 is also referred to as a "second through contact." The TSCs 120 can be configured to electrically couple the devices in the control circuit wafer 200 to wirings/devices at a side of the insulation layer 101 that is distal to the control circuit wafer 200, and hence function as lead outs for the devices in the control circuit wafer 200. The TSCs 120 can be formed of one or more conductor materials, such as one or more of W, Co, Cu, Al, polysilicon, and silicides.

Each TSC 120 includes a column part 122 ("TSC column") mainly in the dielectric layer 106 and a pad part 124 ("TSC pad") mainly in the insulation layer 101 and the first conductor layer 102. The pad part 124 can have a larger size in the horizontal direction (lateral size) than the column part 122. For example, the horizontal cross-section of the pad part 124 and the horizontal cross-section of the column part 122 can both have a circular shape, and the diameter of the pad part 124 in the horizontal direction can be larger than the diameter of the column part 122 in the horizontal direction. As shown in FIG. 1A, each TSC 120 further includes an expansion part 126 extending laterally in the first conductor layer 102 and having a lateral size even larger than the lateral size of the pad part 124. For example, the diameter of the horizontal cross-section of the expansion part 126 can be larger than the diameter of the horizontal cross-section of the pad part 124. The expansion part 126 may electrically couple the TSC 120 to the first conductor layer 102. The formation of the expansion part 126 will be described in more detail below in the description of the example fabrication method of the semiconductor device.

As shown in FIG. 1A, the memory cell wafer 100 further includes a plurality of local insulation layers 132 each surrounding and contacting the pad part 124 of a corresponding TSC 120. The local insulation layer 132 can be formed of one or more dielectric materials, such as one or more of silicon oxide, silicon nitride, and silicon oxynitride.

Figure 1B:
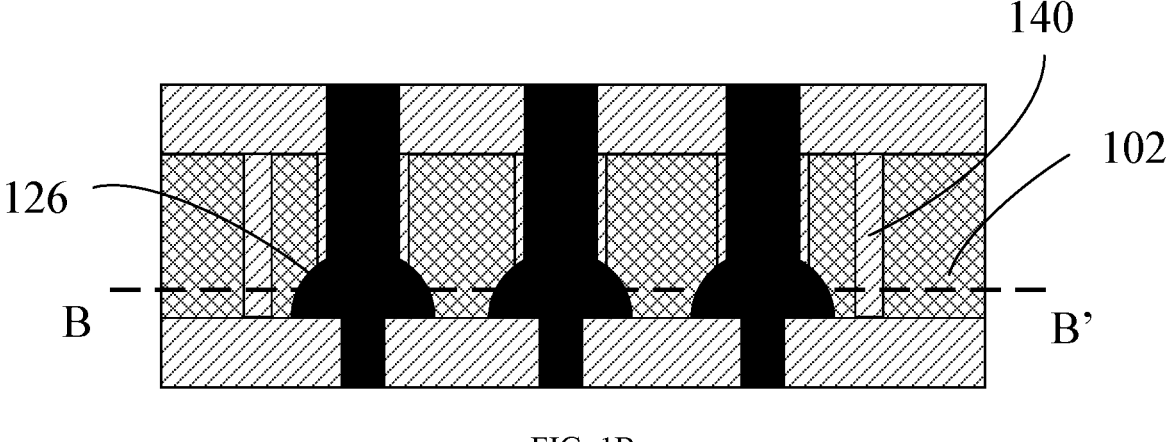
FIG. 1B is an enlarged view of portion A in FIG. 1A.
Figure 1C:
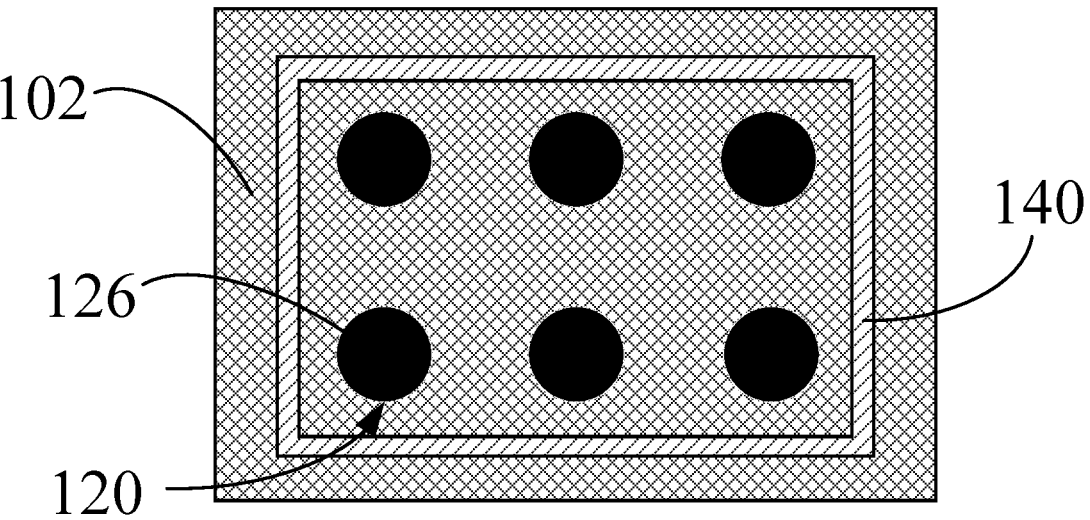
FIG. 1C is a horizontal cross-sectional view along line B-B' in FIG. 1B.

Consistent with the disclosure, the memory cell wafer 100 further includes an isolator 140 surrounding one or more TSCs 120. FIG. 1B is an enlarged view of portion A in FIG. 1A, and FIG. 1C is a cross-sectional view (horizontal cross-sectional view) along line B-B' in FIG. 1B. As shown in FIGS. 1A-1C, the isolator 140 surrounds the one or more TSCs 120 in the horizontal direction and extends in the vertical direction to connect to the insulation layer 101 and the dielectric layer 106. Therefore, although the one or more TSCs 120 contact and hence are electrically coupled to the portion of the first conductor layer 102 (via the expansion parts 126) within the region surrounded by the isolator 140, the isolator 140 isolates the one or more TSCs 120 from other portions of the first conductor layer 102 outside the region surrounded by the isolator 140. Thus, the one or more TSCs 120 are electrically isolated from the other portions of the first conductor layer 102 outside the region surrounded by the isolator 140. As a result, current leakage or short circuit that may be caused by the TSCs 120 (in particular the expansion portions 126 of the TSCs 120) contacting the first conductor layer 102 can be avoided. In this disclosure, a region surrounded by the isolator 140 and electrically isolated from other portions of the first conductor layer 102 is also referred to as an "isolated region."

In the example shown in FIGS. 1A-1C, the isolator 140 does not contact the one or more TSCs 120 that it surrounds. In some other embodiments, the isolator 140 may not contact one or more of the one or more TSCs 120, as long as the isolator 140 can electrically isolate the one or more TSCs 120 from the other portions of the first conductor layer 102 that are outside the region surrounded by the isolator 140.

Figure 2A:
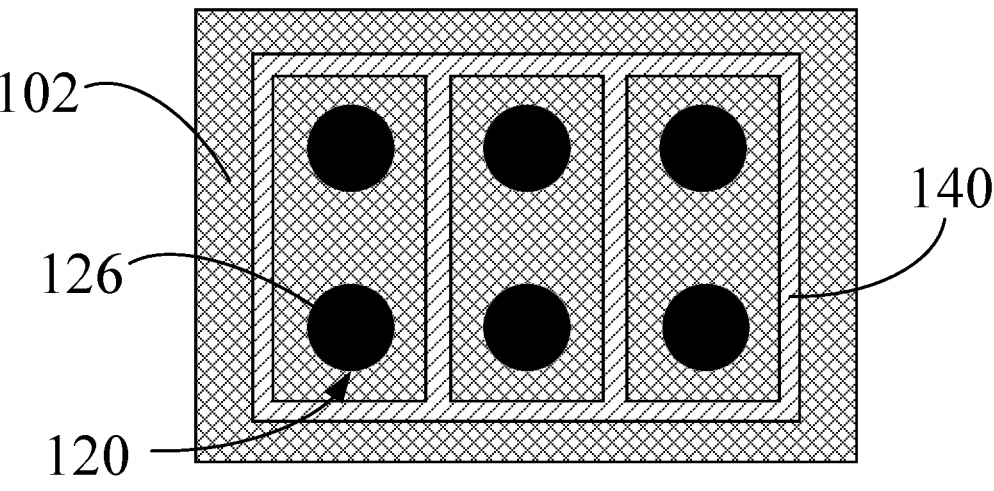
FIGS. 2A-2C are horizontal cross-sectional views showing other examples of the arrangement and configuration of isolator(s) consistent with the disclosure.
Figure 2B:
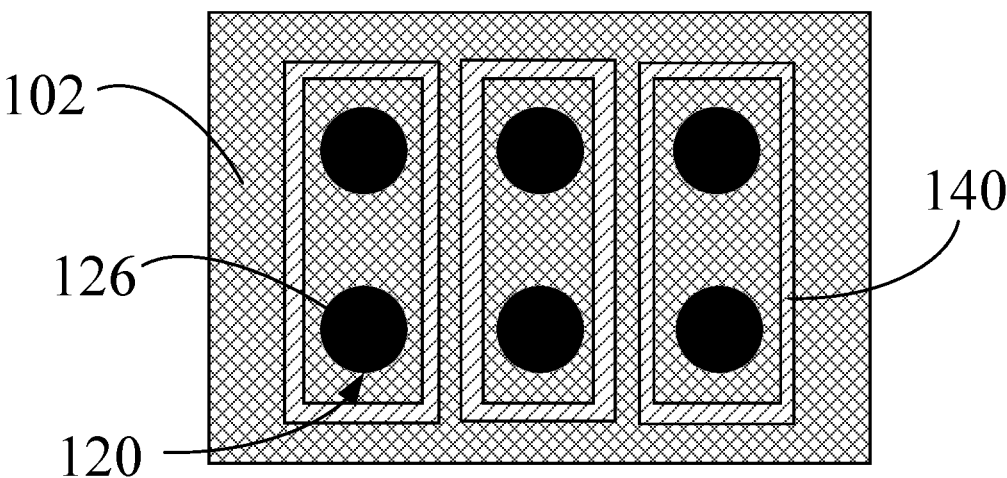

FIGS. 1A-1C only show one isolator 140. Consistent with the disclosure, the memory cell wafer can include a plurality of isolators each surrounding one or more TSCs. FIGS. 2A and 2B each show another example of a portion (similar to portion A in FIG. 1A) of a semiconductor device consistent with the disclosure. The semiconductor devices in FIGS. 2A and 2B each include a plurality of isolators 140 each surrounding one or more TSCs 120. In the example shown in FIG. 2A, the plurality of isolators 140 are connected to each other, while in the example shown in FIG. 2B, the plurality of isolators 140 are separated from each other, e.g., by portions of first conductor layer 102.

In the example shown in FIGS. 1A-1C, six TSCs 120 are surrounded by the isolator 140. The number of TSCs 120 surrounded by one isolator 140 can vary depending on need, as long as TSCs 120 surrounded by a same isolator 140 (i.e., within a same isolated region) do not have to be electrically isolated from each other. For example, some TSCs 120, although not contacting each other directly, are nonetheless electrically coupled to each other by other conductive component(s)/structure(s) of the semiconductor device 10, and thus these TSCs 120 can be arranged within a same isolated region (i.e., surrounded by a same isolator 140).

In some embodiments, even for TSCs 120 that are electrically coupled to each other by other conductive component(s)/structure(s) of the semiconductor device 10, they can still be arranged in different isolated regions (i.e., surrounded by different isolators 140). For example, the TSCs 120 in different isolated regions in FIG. 2A or FIG. 2B may or may not be electrically coupled to each other by other conductive component(s)/structure(s) of the semiconductor device 10.

Figure 2C:
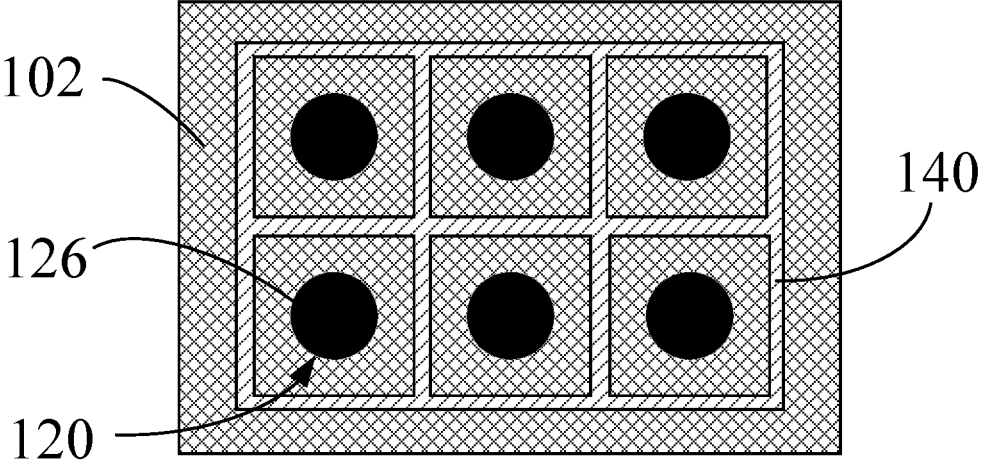

FIG. 2C shows another example of a portion (similar to portion A in FIG. 1A) of a semiconductor device consistent with the disclosure. As shown in FIG. 2C, each TSC 120 is surrounded by one isolator 140, i.e., each isolated region in FIG. 2C contains only one TSC 120. Similar to the discussion above, the TSCs 120 in different isolated regions in FIG. 2C may or may not be electrically coupled to each other by other conductive component(s)/structure(s) of the semiconductor device.

In the examples shown in FIGS. 2A-2C, the plurality of isolators 140 surround the same number of TSC(s) 120. In other embodiments, different isolators 140 can surround same or different numbers of TSC(s) 120. For example, in a same semiconductor device, one isolator 140 can surround one TSC 120 and another isolator 140 can surround two TSCs 120, etc.

In the examples shown in FIGS. 1C and 2A-2C, the horizontal cross-section of an isolator 140 has a rectangular or square shape. In some other embodiments, the horizontal cross-section of an isolator 140 can have another shape, such as circular, triangular, or other polygonal shape, and can be regular polygon or irregular polygon.

In the examples shown in FIGS. 1C and 2A-2C, the horizontal cross-section of a TSC 120 has a circular shape. In some other embodiments, the horizontal cross-section of a TSC can have another shape, such as triangular, square, rectangular, or other polygonal shape, and can be regular polygon or irregular polygon.

Figure 3A:
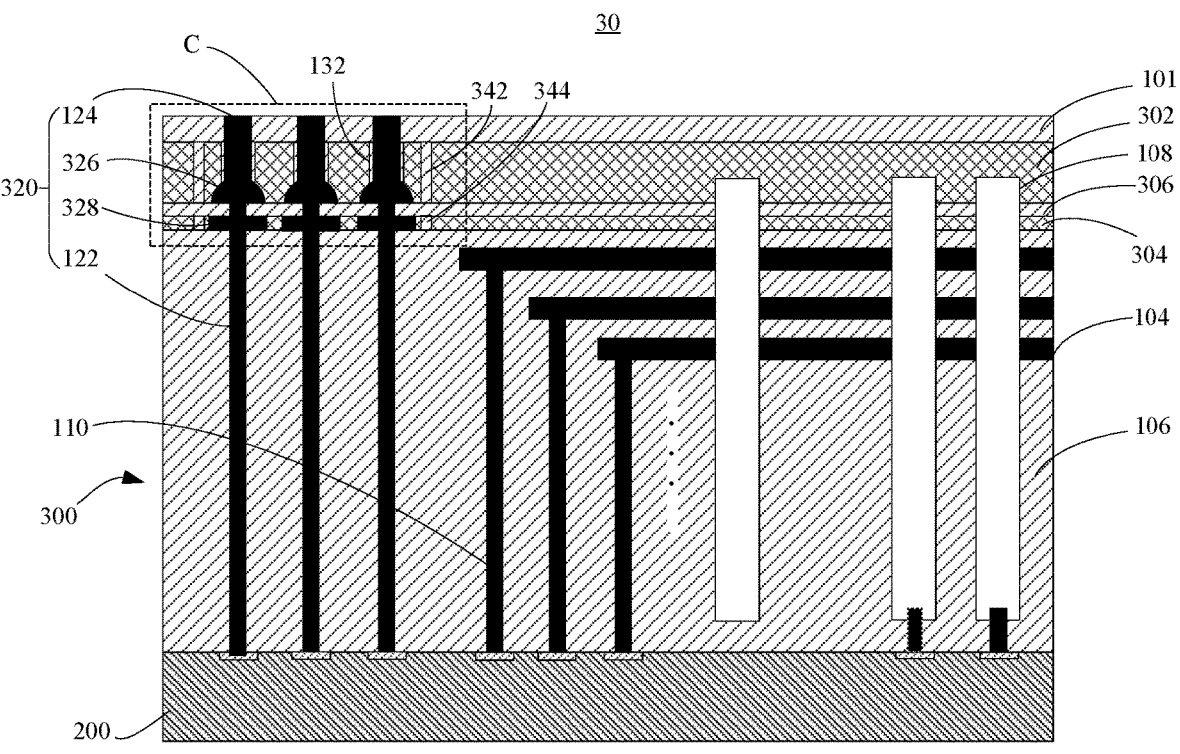
FIG. 3A is a vertical cross-sectional view schematically showing a portion of another example semiconductor device consistent with the disclosure.
Figure 3B:
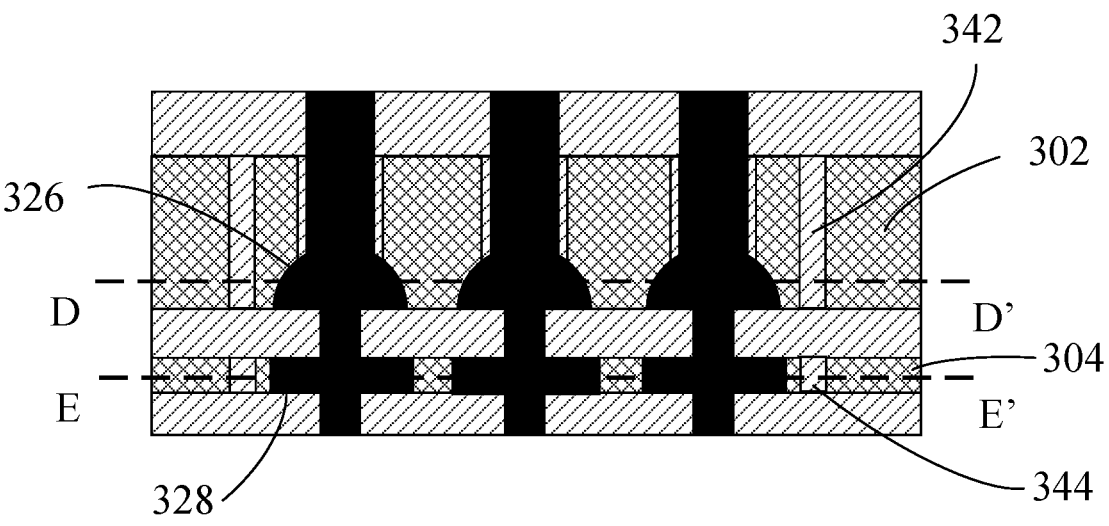
FIG. 3B is an enlarged view of portion C in FIG. 3A.

In the example shown in FIG. 1A, the TSCs 120 penetrate the first conductor layer 102 and hence the isolator 140 is formed in the first conductor layer 102 to surround the one or more TSCs 120. In some other embodiments, the TSCs can penetrate two or more conductor layers and each of the two or more conductor layers may need to be provided with an isolator to surround one or more TSCs. FIG. 3A is a cross-sectional view (vertical cross-sectional view) schematically showing a portion of an example semiconductor device 30 consistent with the disclosure. FIG. 3B is an enlarged view of portion C in FIG. 3A. As shown in FIGS. 3A and 3B, the semiconductor device 30 includes a memory cell wafer 300 bonded to the control circuit wafer 200. The structure of the memory cell wafer 300 is similar to that of the memory cell wafer 100. Descriptions of the parts of the semiconductor device 30 that are same as corresponding parts of the semiconductor device 10 are omitted.

As shown in FIGS. 3A and 3B, the memory cell wafer 300 includes a first conductor layer 302 and a second conductor layer 304 that are separated from each other by a dielectric layer 306. The first conductor layer 302 can be similar to the first conductor layer 102 of the memory cell wafer 100, and can be, e.g., a top conductor layer. The second conductor layer 302 can be a layer for forming bottom select gates (BSGs) for the memory array, and can also be referred to as a BSG layer. The second conductor layer 302 can include, for example, polysilicon.

In the example shown in FIGS. 3A and 3B, the first conductor layer 302 and the second conductor layer 304 are completely separated from each other by the dielectric layer 306. In some other embodiments, the first conductor layer 302 and the second conductor layer 304 may be connected to or electrically coupled to each other in some regions.

The memory cell wafer 300 includes a plurality of TSCs 320 penetrating the insulation layer 101, the first conductor layer 302, the dielectric layer 306, the second conductor layer 304, and the dielectric layer 106. Similar to the TSCs 120 in the semiconductor device 10, each TSC 320 includes a column part 122 and a pad part 124 connected to each other. As shown in FIGS. 3A and 3B, each TSC 320 further includes a first expansion part 326 (similar to the expansion part 126 in the semiconductor device 10) extending laterally in the first conductor layer 302 and a second expansion part 328 extending laterally in the second conductor layer 304. Similar to the expansion part 126, the first expansion part

326 also has a lateral size larger than the lateral size of the pad part 124. Further, the second expansion part 328 has a lateral size larger than the lateral size of the column part 122. In some embodiments, the lateral size of the second expansion part 328 can be larger than that of the first expansion part 326.

Figure 3C:
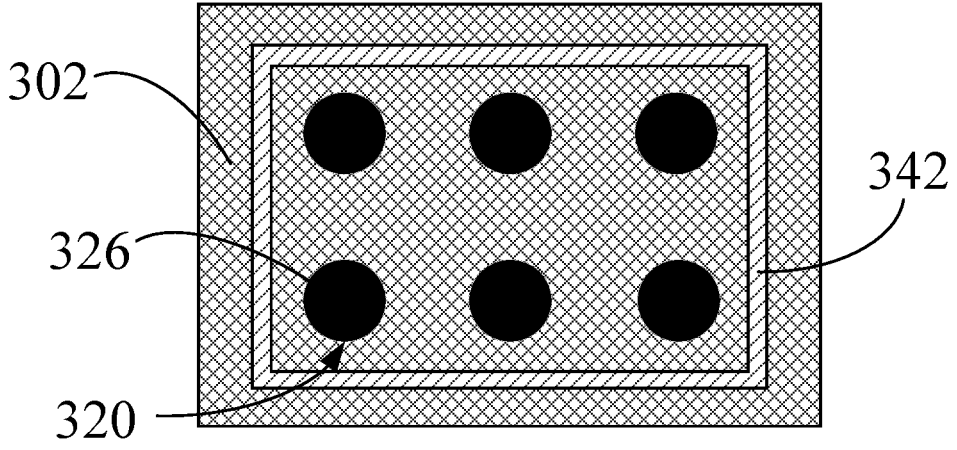
FIG. 3C is a horizontal cross-sectional view along line D-D' in FIG. 3B.

Consistent with the disclosure, the memory cell wafer 300 further includes a first isolator 342 in the first conductor layer 302 and surrounding one or more TSCs 320, and a second isolator 344 in the second conductor layer 304 and surrounding one or more TSCs 320. FIG. 3C is a cross-sectional view (horizontal cross-sectional view) along line D-D' in FIG. 3B, and FIG. 3D is a cross-sectional view (horizontal cross-sectional view) along line E-E' in FIG. 3B.

As shown in FIGS. 3A-3C, the first isolator 342 surrounds the one or more TSCs 320 in the horizontal direction and extends in the vertical direction to connect to the insulation layer 101 and the dielectric layer 306. Therefore, although the one or more TSCs 320 contact and hence are electrically coupled to the portion of the first conductor layer 302 (via the first expansion parts 326) within the isolated region surrounded by the first isolator 342, the first isolator 342 isolates the one or more TSCs 320 from other portions of the first conductor layer 302 outside the isolated region surrounded by the first isolator 342. Thus, the one or more TSCs 320 are electrically isolated from the other portions of the first conductor layer 302 outside the isolated region surrounded by the first isolator 342.

Figure 3D:
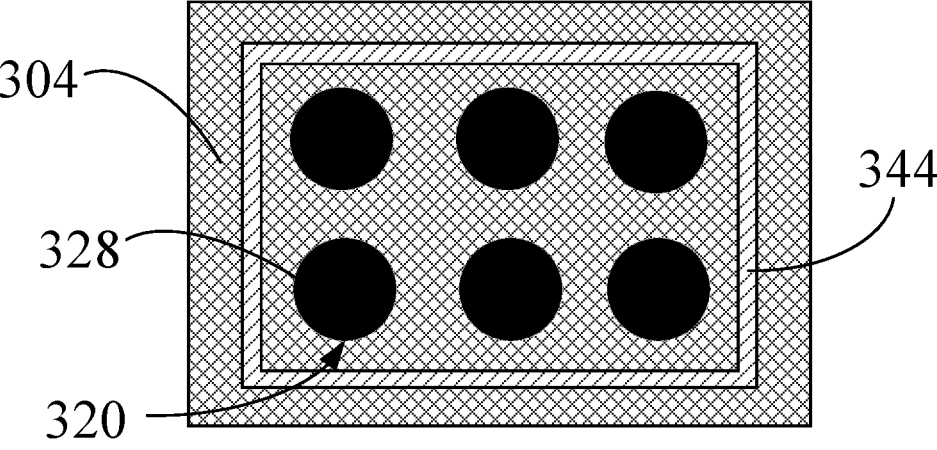
FIG. 3D is a horizontal cross-sectional view along line E-E' in FIG. 3B.

Similarly, as shown in FIGS. 3A, 3B, and 3D, the second isolator 344 surrounds the one or more TSCs 320 in the horizontal direction and extends in the vertical direction to connect to the dielectric layer 306 and the dielectric layer 106. Therefore, although the one or more TSCs 320 contact and hence are electrically coupled to the portion of the second conductor layer 304 (via the second expansion parts 328) within the isolated region surrounded by the second isolator 344, the second isolator 344 isolates the one or more TSCs 320 from other portions of the second conductor layer 304 outside the isolated region surrounded by the second isolator 344. Thus, the one or more TSCs 320 are electrically isolated from the other portions of the second conductor layer 304 outside the isolated region surrounded by the second isolator 344.

Due to the existence of the first isolator 342 and the second isolator 344, current leakage or short circuit that may be caused by the TSCs 320 contacting the first conductor layer 302 (via the first expansion portions 326) and/or contacting the second conductor layer 304 (via the second expansion portions 328) can be avoided.

In the example shown in FIGS. 3A-3D, the memory cell wafer 300 includes one first isolator 342 and one second isolator 344. In some other embodiments, the memory cell wafer 300 can include two or more first isolators 342 in the first conductor layer 302 and/or two or more second isolators 344 in the second conductor layer 304. The horizontal arrangement and configuration of the two or more first isolators 342 and/or the horizontal arrangement and configuration of the two or more second isolators 344 can be similar to those of the two or more isolators 140 shown in FIGS. 2A-2C, and the description thereof is omitted.

In the example shown in FIGS. 3A-3D, the first isolator 342 is aligned with the second isolator 344 in the vertical direction, e.g., a projection of the first isolator 342 on the insulation layer 101 is the same as and overlaps a projection of the second isolator 344 on the insulation layer 101. In some other embodiments, the first isolator 342 and the second isolator 344 are not aligned with each other in the vertical direction and may staggered with respect to each other. A lateral size of the first isolator 342 (as well as the isolated region surrounded by the first isolator 342) may be different from a lateral size of the second isolator 344 (as well as the isolated region surrounded by the second isolator 344).

Figure 4A:
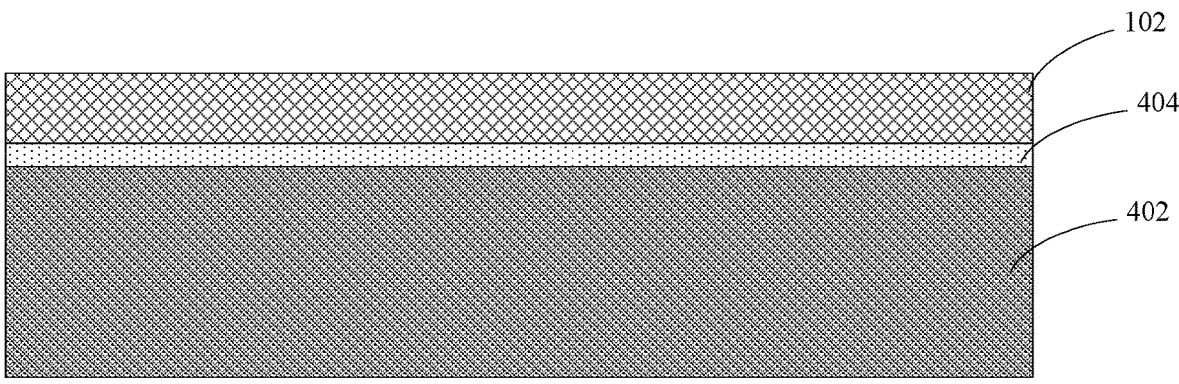
FIGS. 4A-4O are vertical cross-sectional views showing certain processes during an example fabrication of an example semiconductor device consistent with the disclosure.
Figure 4B:
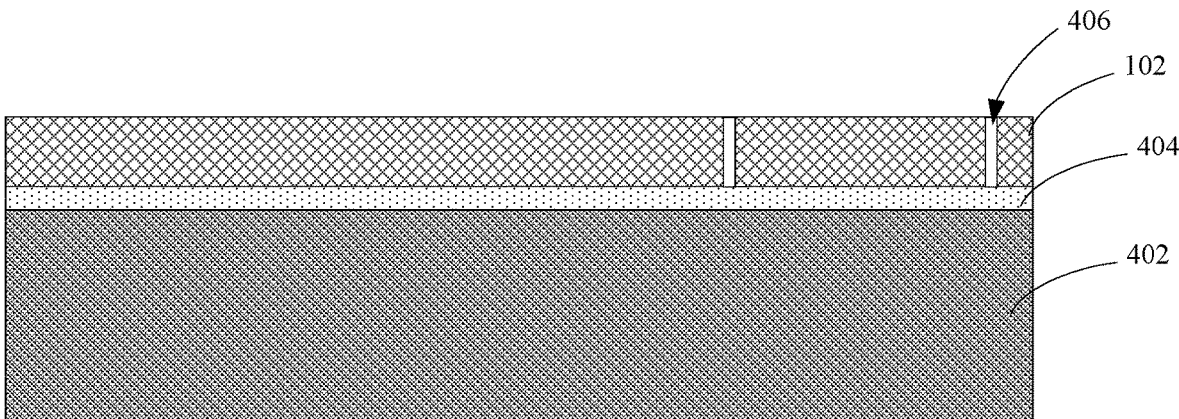
Figure 4C:
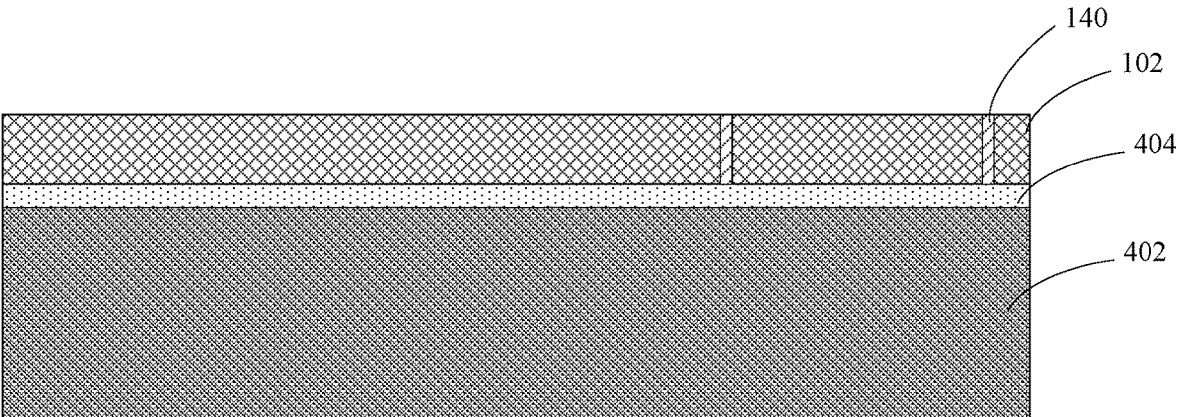
Figure 4D:
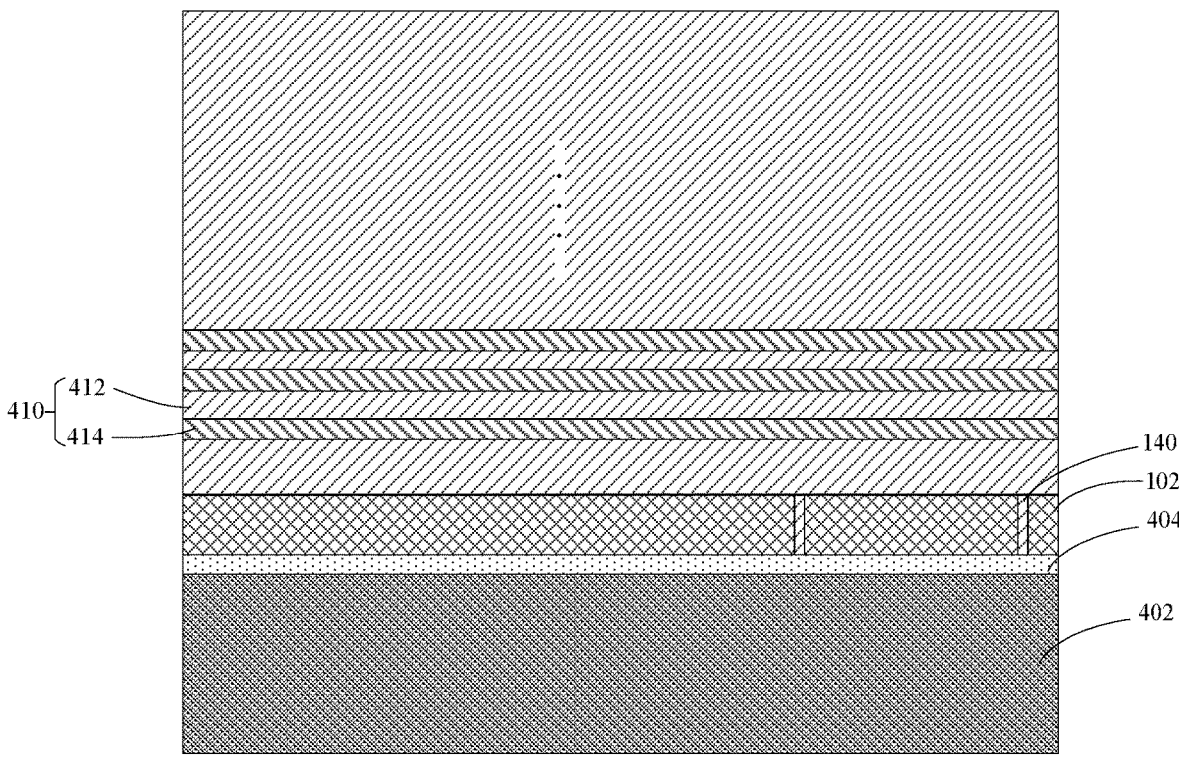
Figure 4E:
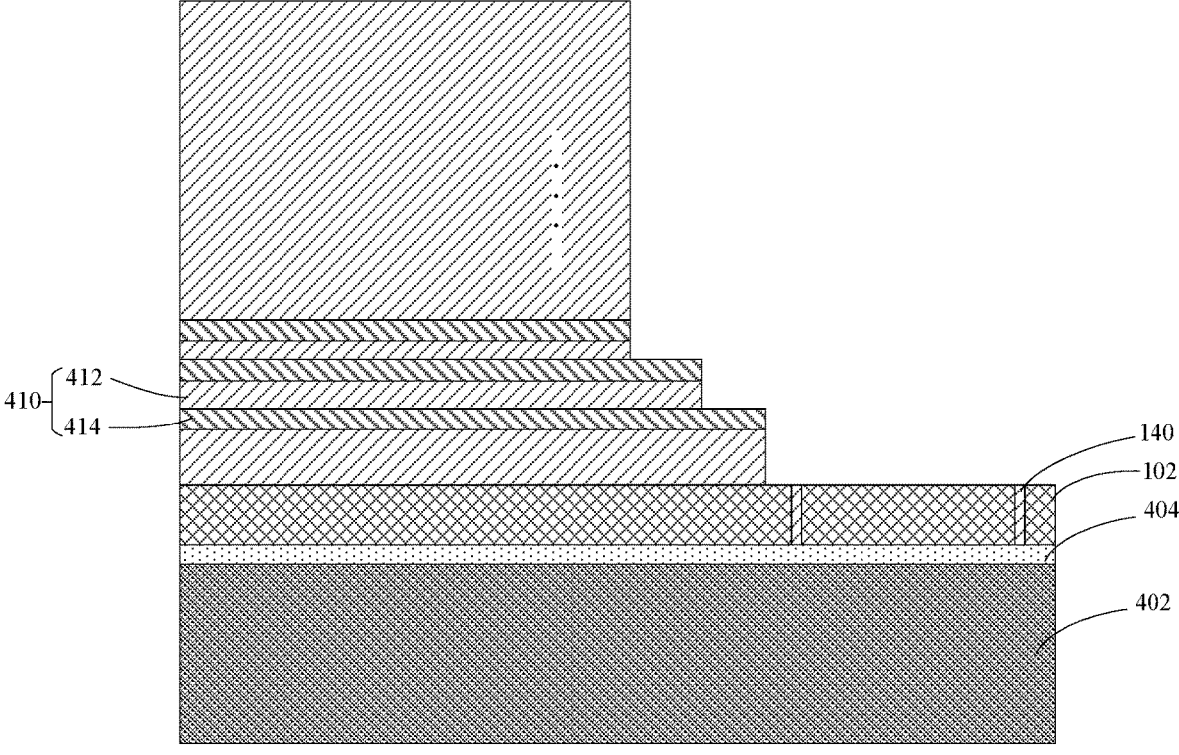
Figure 4F:
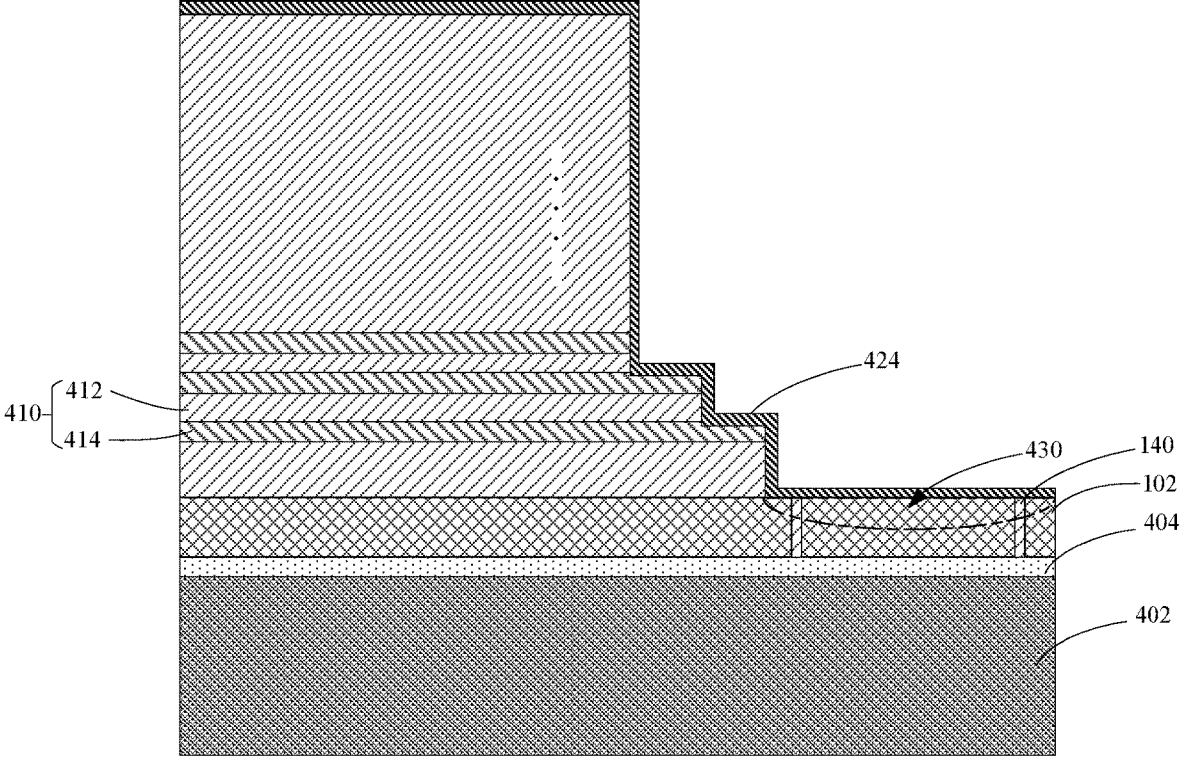
Figure 4G:
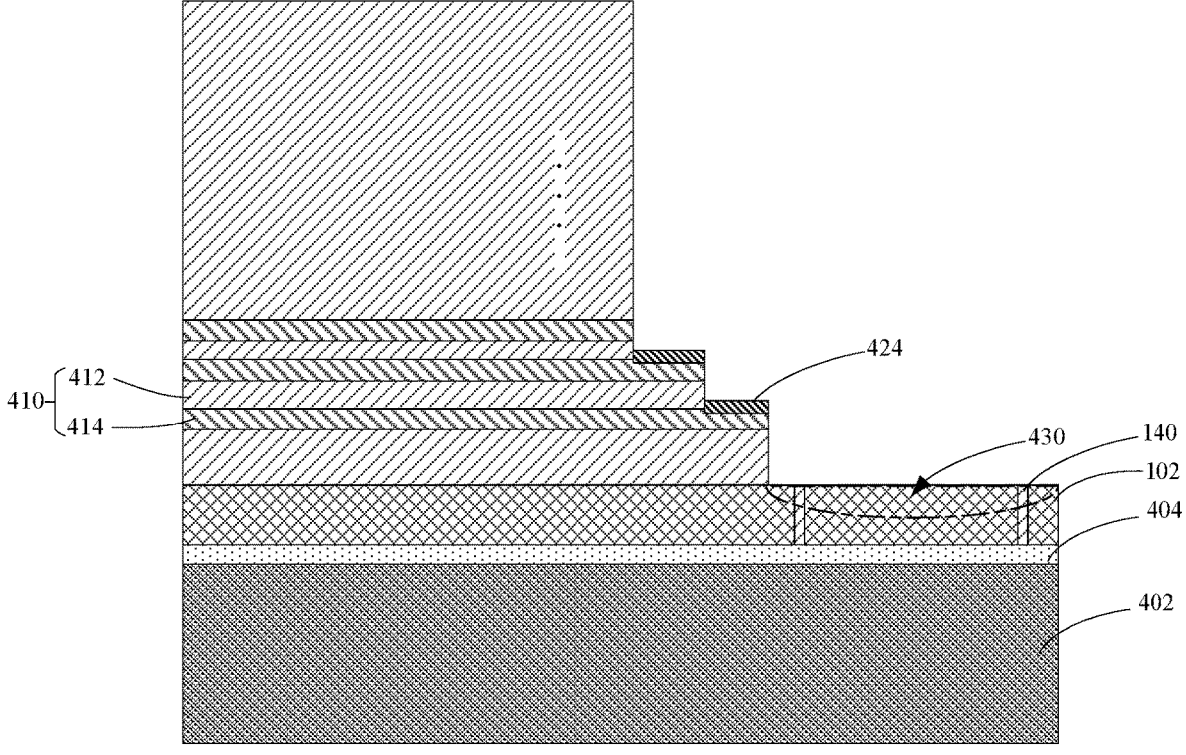
Figure 4H:
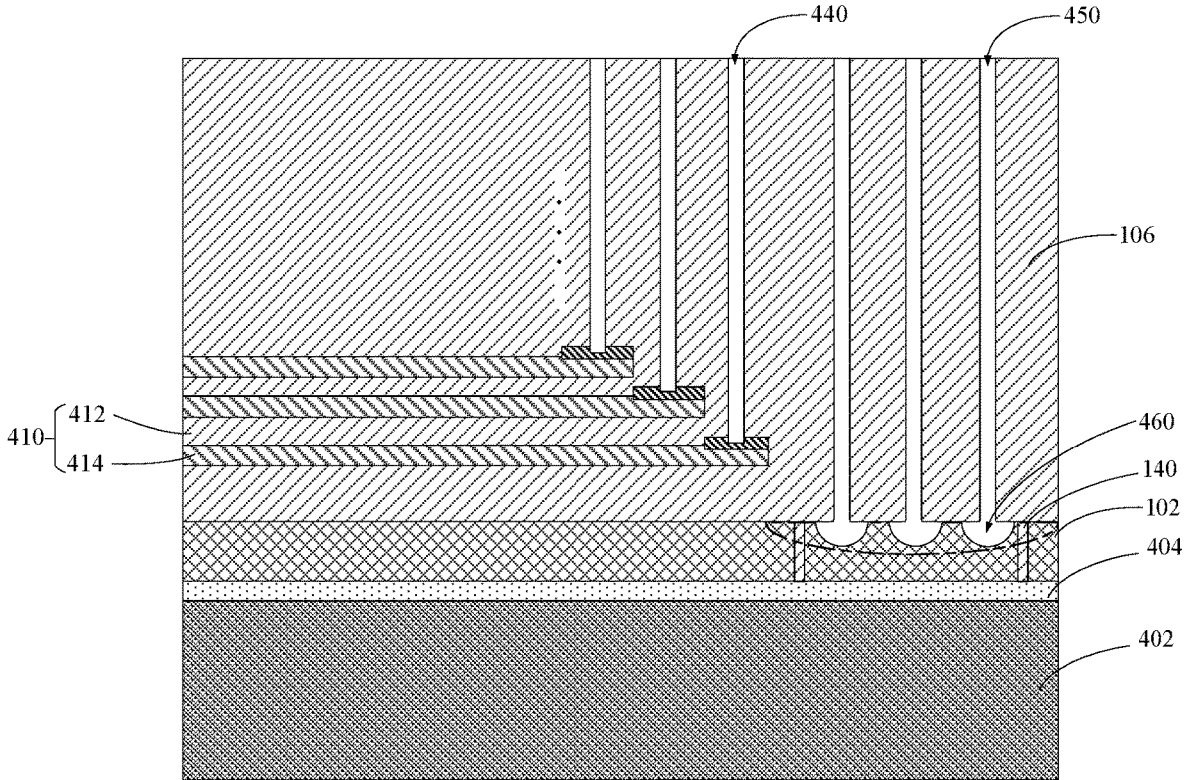
Figure 4I:
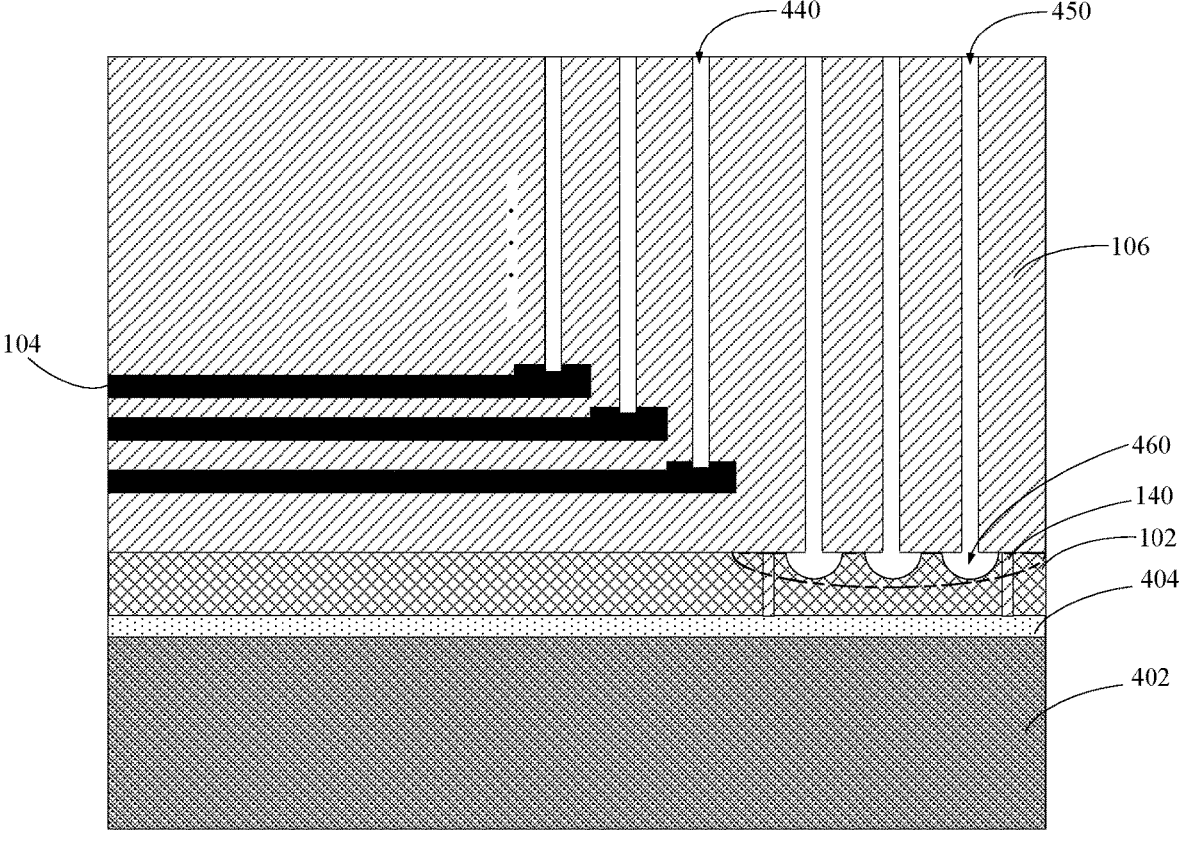
Figure 4J:
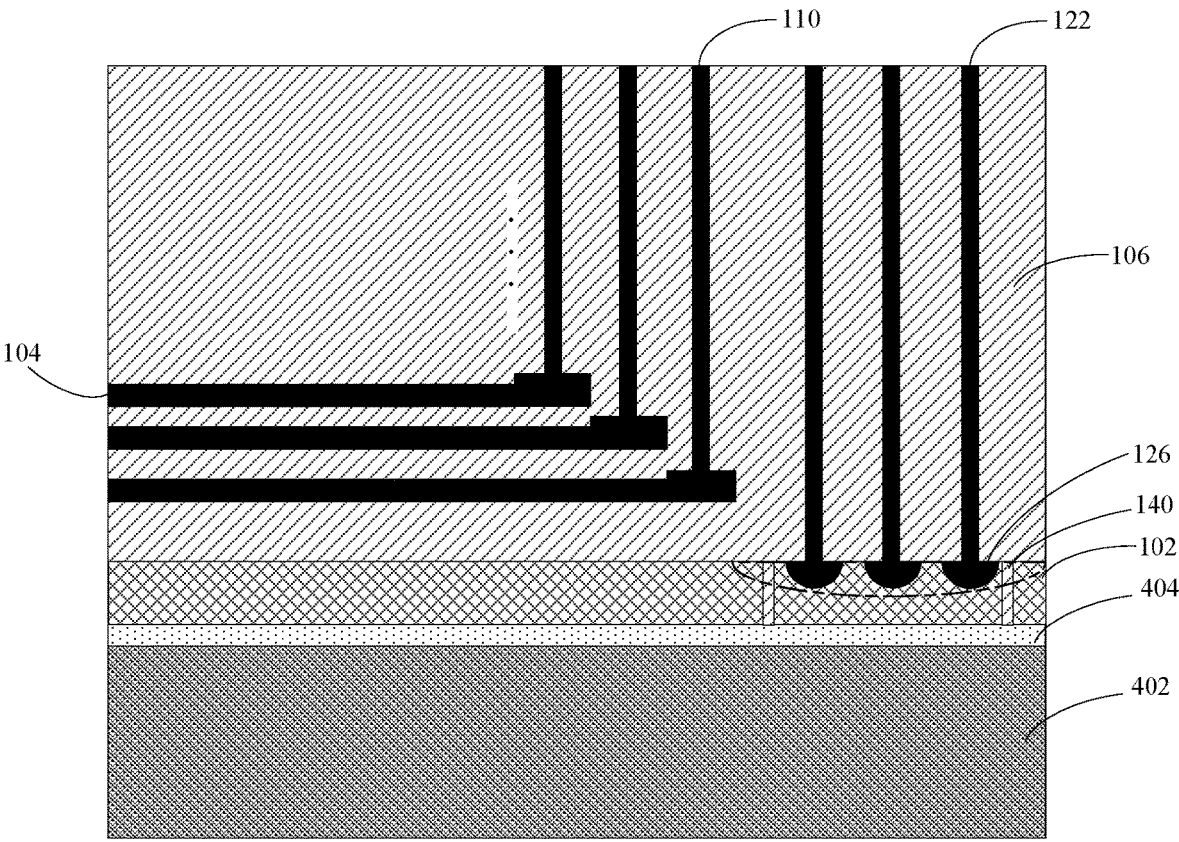
Figure 4K:
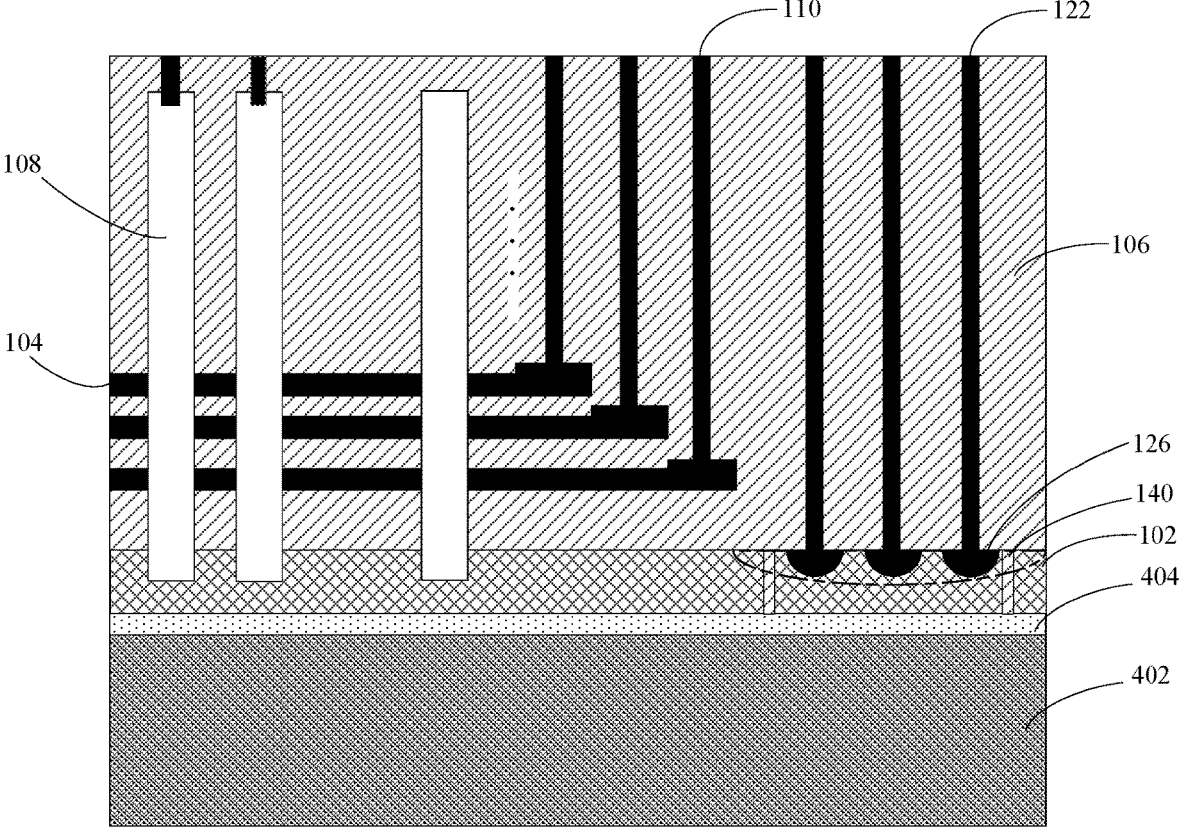
Figure 4L:
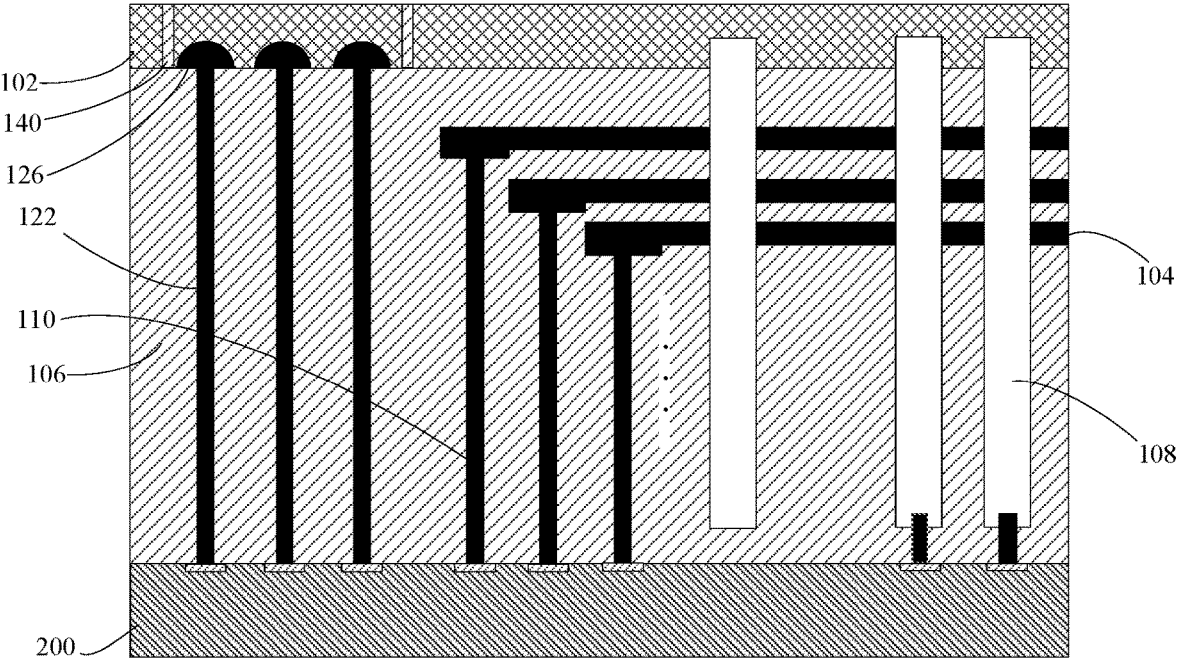
Figure 4M:
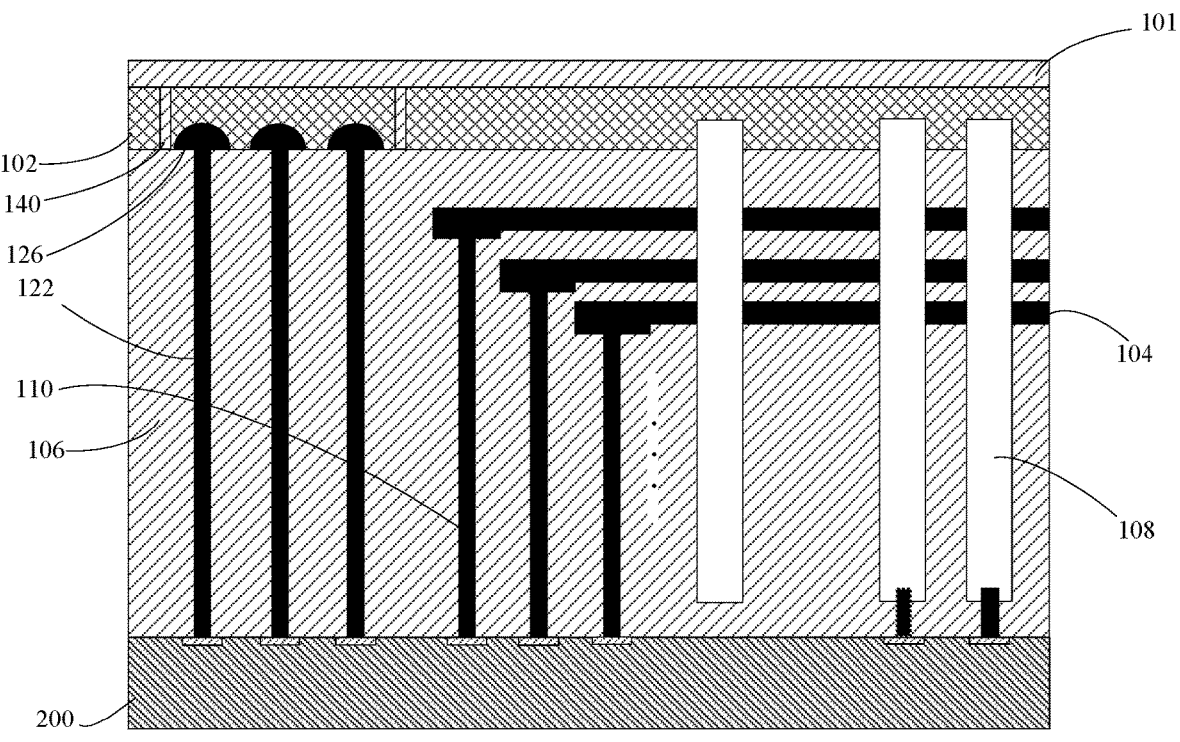
Figure 4N:
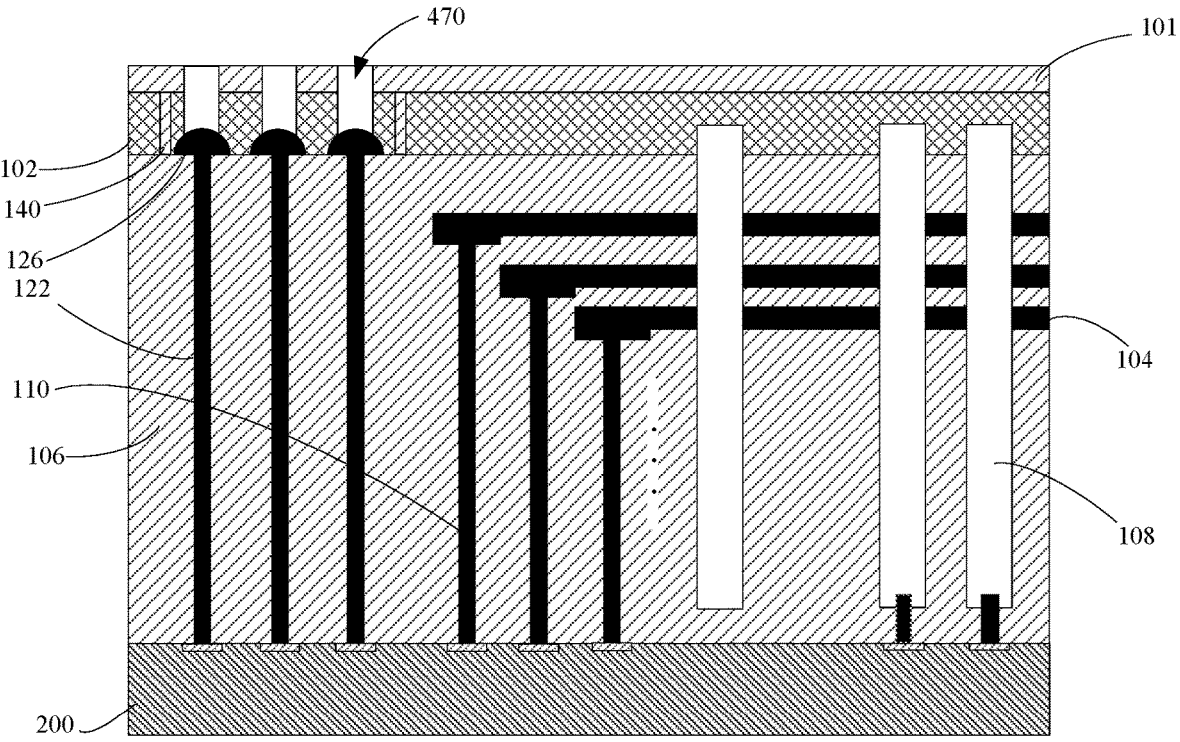
Figure 4O:
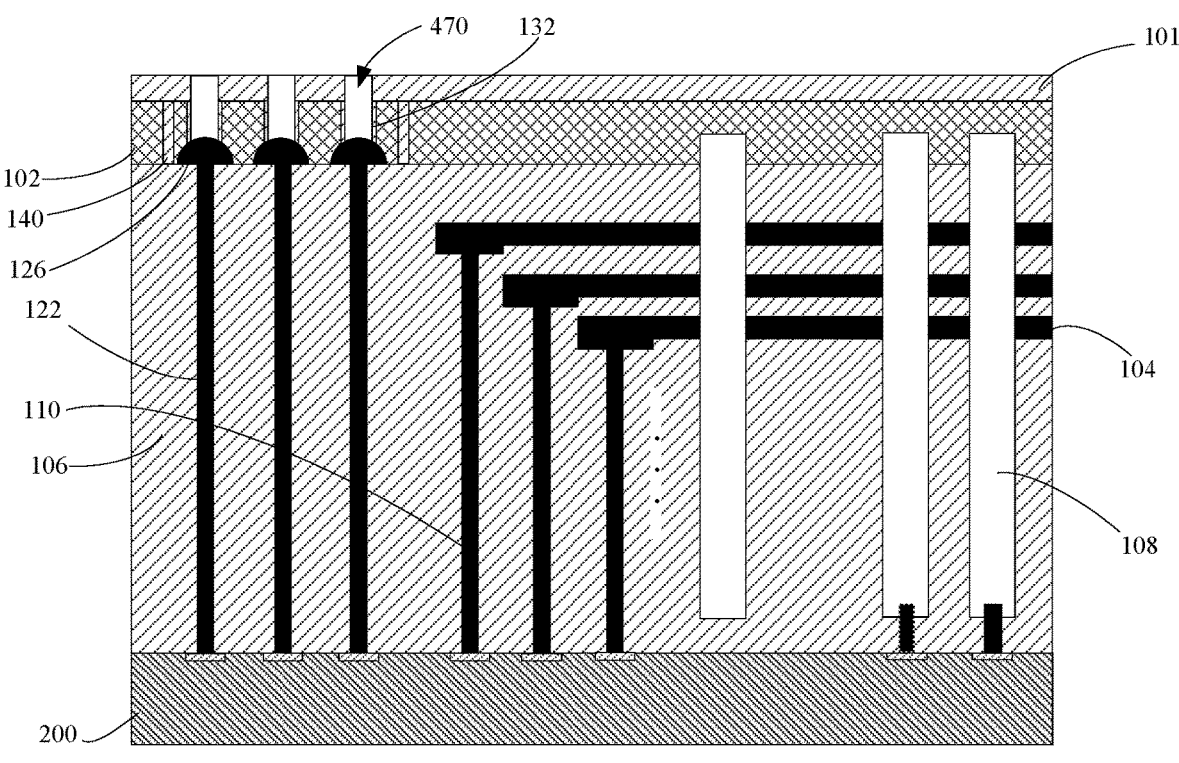

FIGS. 4A-4O are cross-sectional views showing certain processes during an example fabrication of an example semiconductor device consistent with the disclosure. FIGS. 4A-4O only show a portion of the semiconductor device. The fabrication of the semiconductor device 10 in FIGS. 1A-1C is shown in FIGS. 4A-4O and described below as an example. Other semiconductor devices consistent with the disclosure, such as those shown in FIGS. 2A-2C and 3A-3D and described above, can be fabricated in a similar manner.

At the stage shown in FIG. 4A, a starting wafer is provided. The starting wafer includes a substrate 402, a sacrificial layer 404 formed over the substrate 402, and the first conductor layer 102 formed over the sacrificial layer 404. The substrate 402 can be formed of one or more suitable semiconductor materials, such as silicon (Si), germanium (Ge), silicon germanium (SiGe), indium phosphide (InP), gallium arsenide (GaAs), gallium nitride (GaN), or silicon carbide (SiC), or a combination of suitable semiconductor and insulation materials, such as silicon on insulator (SOI). Further, the substrate 402 can be single crystalline or part of the substrate 402 may be amorphous or polycrystalline. The sacrificial layer 404 can include any suitable material, such as one or more dielectric materials, e.g., one or more of silicon oxide, silicon nitride, and silicon oxynitride. In some embodiments, there can be one or more other layers between the substrate 402 and the sacrificial layer 404, and/or between the sacrificial layer 404 and the first conductor layer 102.

Then, photolithography and etching processes are performed to form a trench 406 in the first conductor layer 102, as shown in FIG. 4B. The trench 406 surrounds a region of the first conductor layer 102. Further, the trench 406 can extend through the first conductor layer 102 to expose a portion of the sacrificial layer 404, and can electrically isolate the surrounded region of the first conductor layer 102 from other portions of the first conductor layer 102. At the stage shown in FIG. 4C, an insulation material is filled in the trench 406 to form the isolator 140.

During the fabrication process of a semiconductor device, multiple photolithography processes need to be performed for forming various patterns in various layers. To ensure that the patterns in different layers can be properly aligned, alignment marks may need to be formed in certain layers. For example, alignment marks can be formed in the first conductor layer 102 for the alignment in subsequent photolithography processes. These alignment marks are also referred to as zero marks. In some embodiments of the disclosure, the isolator 140 can be formed together with the zero marks. That is, the pattern for the isolator 140 can be added to the photolithography mask for forming the zero marks, and a material for forming the zero marks can also be used as the material for the isolator 140. Therefore, no extra processing step, mask, and material are needed for forming the isolator 140. Consequently, no extra cost is needed. That is, consistent with the disclosure, isolation effect brought about by the isolator 140 can be realized without adding cost to the fabrication process of the semiconductor device.

The processes described above and shown in FIGS. 4A-4C are processes in the fabrication of the semiconductor device 10. In the fabrication of other semiconductor devices consistent with the disclosure, more conductor layers can be provided in these processes and isolator(s) can be formed in each of the conductor layers. For example, in the fabrication of the semiconductor device 30 shown in FIG. 3A, the starting wafer can include the first conductor layer 302, the dielectric layer 306, and the second conductor layer 304 formed over the sacrificial layer 404, and the first conductor layer 302, the dielectric layer 306, and the second conductor layer 304 can be etched and filled with suitable material to form the first isolator 342 and the second isolator 344. The subsequent processes for forming the semiconductor device 30 can be similar to those for forming the semiconductor device 10, which are described in more detail below.

FIG. 4D schematically shows a next stage during the fabrication of the semiconductor device 10. As shown in FIG. 4D, a plurality of dielectric pairs 410 are formed over the first conductor layer 102 that has the isolator 140 formed therein. Each dielectric pair 410 includes a first dielectric layer 412 and a second dielectric layer 414 stacked one over another. The first dielectric layer 412 and the second dielectric layer 414 can be formed of different dielectric materials. For example, the first dielectric layer 412 can be formed of silicon oxide and the second dielectric layer 414 can be formed of silicon nitride.

At the stage shown in FIG. 4E, photolithography and etching are performed to form a staircase-like structure, with the second dielectric layers 414 becoming shorter one after another away from the substrate 402. That is, each second dielectric layer 414 is shorter than a neighboring second dielectric layer 414 that is closer to the substrate 402. FIG. 4E is merely for illustrative purposes. The structure shown in FIG. 4E can be the final staircase-like structure, or can be an intermediate staircase-like structure during the process, with one or more second dielectric layers 414 not yet exposed.

The process of forming the staircase-like structure can include multiple rounds of etchings, with each round of etchings being performed to form one "step" of the staircase-like structure. Each round of etchings can include a first selective etching using an etchant that can etch the material of the first dielectric layer 412 much faster than the material of the second dielectric layer 414, and a second selective etching using an etchant that can etch the material of the second dielectric layer 414 much faster than the material of the first dielectric layer 412. Thus, the first selective etching can "stop" at the second dielectric layer 414 and the second selective etching can "stop" at the first dielectric layer 412.

However, in reality, since the etchant for etching the first dielectric layer 412 can still etch the second dielectric layer 414 (although very slowly), the first selective etching may not stop "perfectly" at the second dielectric layer 414 as in the ideal case. Therefore, during each first selective etching, the exposed portion of a second dielectric layer 414 may still be etched by a small amount. The closer is a second dielectric layer 414 is to the substrate 402, the more rounds of first selective etchings is that second dielectric layer 414 subject to, and hence the more amount of that second dielectric layer 414 may be etched away and the exposed portion of that second dielectric layer 414 may become thinner. Thinning of the second dielectric layer 414 may result in negative consequence in the final semiconductor device, such as higher resistance or even circuit disconnection. Therefore, during the process of forming the staircase-like structure, exposed second dielectric layers 414 may need to be "thickened" by depositing a layer of the dielectric material, such as silicon nitride, used for the second dielectric layers 414. For example, as shown in FIG. 4F, a thickening layer 424 containing a same material, such as silicon nitride, as the second dielectric layers 414 is deposited to cover the exposed surfaces of the entire structure, including the exposed surfaces of the second dielectric layers 414, and hence "thickening" the exposed portions of the second dielectric layers 414. In FIG. 4F, using different shadings for the thickening layer 424 and the second dielectric layers 414 is merely for illustrative purposes, but does not necessarily mean that the thickening layer 424 is formed of a different material than the second dielectric layers 414.

However, the raw materials (deposition precursors) for forming the thickening layer 424 may contain an undesired element such as chlorine (Cl). During or after the deposition of the thickening layer 424, atoms of the undesired element may diffuse into the first conductor layer 102, contaminating a portion of the first conductor layer 102 to form a contaminated region 430, as shown in FIG. 4F. Contamination of the first conductor layer 102 by the undesired element, e.g., contamination of the polysilicon in the first conductor layer 102 by chlorine from the raw materials for the thickening layer 424, can cause the material in the contaminated region 430 to change property, resulting in undesired reaction as described in more detail below.

As shown in FIG. 4G, portions of the thickening layer 424 on surfaces other than the exposed portions of the second dielectric layers 414, such as those on top, bottom, and sidewall shown in the figure, are removed. Hence the portions of the thickening layer 424 on the exposed portions of the second dielectric layers 414 are separated from each other and become parts of the corresponding second dielectric layers 414. In some embodiments, the portions of the thickening layer 424 on the exposed portions of the second dielectric layers 414 may also be thinned.

The process described above in connection with FIGS. 4F and 4G can also be referred to as "thickening process" for thickening the exposed second dielectric layers 414. The thickening process can be performed once or more times during the process of forming the staircase-like structure as needed. For example, the thickening process can be performed after each round of etching that exposes one second dielectric layer 414 to thicken the newly exposed dielectric layer 414 and previously exposed dielectric layer(s) 414 if any. As another example, the thickening process can be performed after several rounds of etching and multiple second dielectric layers 414 are exposed.

After the staircase-like structure is formed, a dielectric material is deposited to cover the entire structure, as shown in FIG. 4H. The deposited dielectric material can be the same as the material for the first dielectric layers 412, such as silicon oxide. The deposited dielectric material, together with the first dielectric layers 412 (and other similar dielectric layers), can form the dielectric layer 106 in the final semiconductor device. Further, the dielectric layer 106 is patterned and etched to form through array vias (TAVs) 440 to expose portions of the second dielectric layers 414 and form through silicon vias (TSVs) 450 to expose portions of the first conductor layer 102.

The dielectric layer 106 can be patterned by photolithography using a photoresist. After the TAVs 440 and TSVs 450 are formed, the remaining photoresist can be removed. The chemical for removing the photoresist can also reach the bottoms of the TSVs 450. Because the property of the conductor material in the contaminated region 430 has been changed as described above, the contaminated conductor material may become also prone to erosion by the chemical for removing the photoresist. Therefore, a void 460 is formed at the bottom of a TSV 450.

At the stage shown in FIG. 4I, the second dielectric layers 414 are substituted with one or more conductor materials, such as one or more of W, Co, Cu, Al, polysilicon, and silicides, to form the conductor layers 104.

At the stage shown in FIG. 4J, one or more conductor materials, such as one or more of W, Co, Cu, Al, polysilicon, and silicides, are deposited into the TAVs 440, the TSVs 450, and the voids 460. The conductor material(s) deposited in the TAVs 440 form the TACs 110. The conductor material(s) deposited in the TSVs 450 form the TSV columns 122. The conductor material(s) deposited in the voids 460 form the expansion parts 126 of the TSCs 120.

At the stage shown in FIG. 4K, other components/structures, such as the memory strings 108, of the memory cell wafer 100 are formed. FIG. 4K only shows an example for illustrative purposes. In some embodiments, some components/structures, such as the memory strings 108, can be formed before the processes described above, such as before the second dielectric layers 414 are substituted with conductor layers 104.

At the stage shown in FIG. 4L, the memory cell wafer 100 is flipped and bonded to the control circuit wafer 200. Then the substrate 402 and the sacrificial layer 404 are removed by, for example, polishing (such as chemical-mechanical polishing (CMP)) and/or etching (such as dry etching and/or wet etching), to expose the first conductor layer 102, as shown in FIG. 4L.

At the stage shown in FIG. 4M, one or more dielectric materials are deposited over the first conductor layer 102 to form the insulation layer 101.

At the stage shown in FIG. 4N, photolithography and etching are performed to form holes 470 corresponding to the TSV columns 122 in the insulation layer 101 and the first conductor layer 102.

At the stage shown in FIG. 4O, a local insulation layer 132 is formed at an inner sidewall of the portion of each hole 470 in the first conductor layer 102. For example, the first conductor layer 102 includes polysilicon and the local insulation layer 132 can be formed by, e.g., thermal oxidization of the polysilicon at the sidewall of the corresponding hole 470.

Then, one or more conductor materials, such as one or more of W, Co, Cu, Al, polysilicon, and silicides, can be deposited into the holes 470 to form the TSC pads 124, and hence forming the semiconductor device 10 shown in FIG. 1A.

Figure 5:
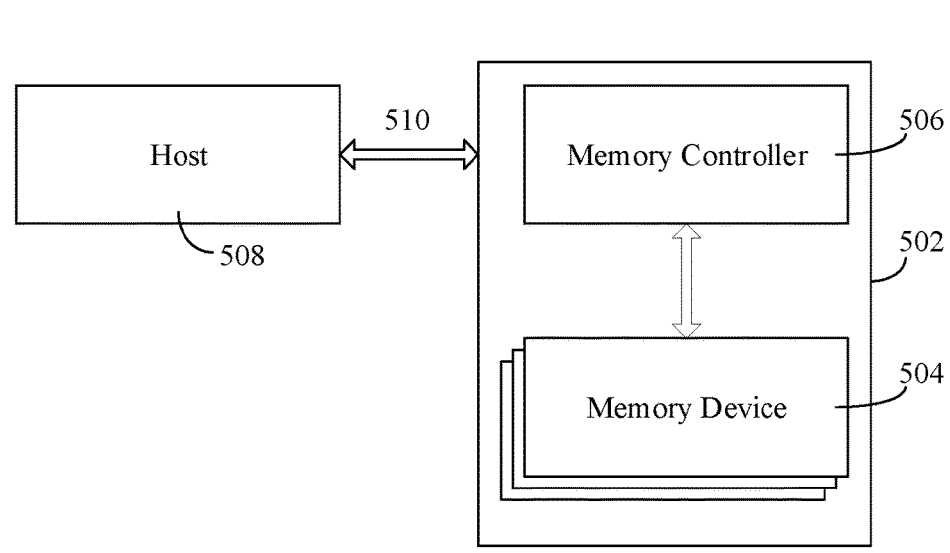
FIG. 5 is a block diagram of an example system consistent with the disclosure.

FIG. 5 is a block diagram of an example system 500 having a memory device consistent with the disclosure. The system 500 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 5, the system 500 includes a host 508 and a memory system 502 having one or more memory devices 504 and a memory controller 506. The host 508 can be a processor of an electronic device, such as a central processing unit (CPU), or a system-on-chip (SoC), such as an application processor (AP). The host 508 can be configured to send or receive data to or from the one or more memory devices 504. Each of the one or more memory devices 504 can include a semiconductor device consistent with the disclosure, such as one of the example semiconductor devices described above.

The memory controller 506 is coupled to the one or more memory devices 504 and the host 508, and is configured to control the one or more memory devices 504, according to some implementations. The memory controller 506 can also be integrated into the one or more memory devices 504. The memory controller 506 can manage the data stored in the one or more memory devices 504 and communicate with the host 508 via an interface 510. In some embodiments, the memory controller 506 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other embodiments, the memory controller 506 is designed for operating in a high duty-cycle environment, such as a solid-state drive (SSD) or an embedded multi-media-card (eMMC) used as data storage for mobile devices, such as smartphones, tablets, laptop computers, etc., and enterprise storage arrays. The memory controller 506 can be configured to control operations of the one or more memory devices 504, such as read, erase, and program operations.

Figure 6:
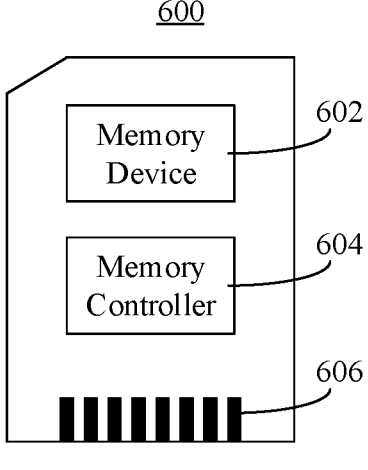
FIG. 6 is a block diagram of an example memory card consistent with the disclosure.
Figure 7:
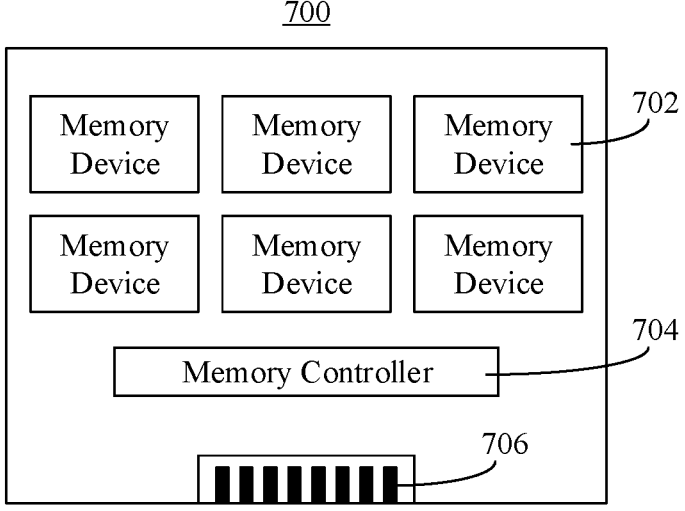
FIG. 7 is a block diagram of an example solid-state drive consistent with the disclosure.

The memory controller 506 and the one or more memory devices 504 can be integrated into various types of storage devices, for example, be included in the same package, such as a universal Flash storage (UFS) package or an eMMC package. That is, the memory system 502 can be implemented and packaged into different types of end electronic products. FIGS. 6 and 7 are block diagrams of an example memory card 600 and an example SSD 700, respectively, consistent with the disclosure. As shown in FIG. 6, a single memory device 602 and a memory controller 604 are integrated into the memory card 600. The memory device 602 can include a semiconductor device consistent with the disclosure, such as one of the above-described example semiconductor devices. The memory card 600 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 6, the memory card 600 further includes a memory card interface or interface connector 606 configured to couple the memory card 600 to a host (e.g., the host 508 shown in FIG. 5).

As shown in FIG. 7, multiple memory devices 702 and a memory controller 704 are integrated into the SSD 700. Each of the memory devices 702 can include a semiconductor device consistent with the disclosure, such as one of the above-described semiconductor devices. As shown in FIG. 7, the SSD 700 further includes an SSD interface or interface connector 706 configured to couple the SSD 700 to a host (e.g., the host 508 shown in FIG. 5).

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device comprising:
   a memory cell wafer including:
      a dielectric layer;
      a conductor layer over the dielectric layer;
      one or more through contacts penetrating through the dielectric layer and the conductor layer, each of the one or more through contacts including:

a column part in the dielectric layer; and
      a pad part in the conductor layer; and
      an isolator in the conductor layer, the isolator surrounding a region of the conductor layer and at least one of the one or more through contacts in a horizontal direction and extending vertically through the conductor layer to be connected to the dielectric layer, and the region of the conductor layer surrounded by the isolator being isolated from other portions of the conductor layer.

2. The semiconductor device of claim 1, wherein:
   the one or more through contacts include a plurality of through contacts; and
   the isolator is one of a plurality of isolators in the conductor layer and each surrounding at least one of the plurality of through contacts.

3. The semiconductor device of claim 2, wherein the plurality of isolators are separated from each other.

4. The semiconductor device of claim 2, wherein at least two of the isolators are connected to each other.

5. The semiconductor device of claim 2, wherein one of the plurality of isolators surrounds a first number of the through contacts, another one of the plurality of isolators surrounds a second number of the through contacts, and the first number is different from the second number.

6. The semiconductor device of claim 2, wherein a number of the isolators is same as a number of the through contacts, and each of the isolators only surrounds one of the through contacts.

7. The semiconductor device of claim 1, wherein:
   the conductor layer is a first conductor layer, the dielectric layer is a first dielectric layer, and the isolator is a first isolator; and
   the memory cell wafer further includes:
      a second conductor layer between the first conductor layer and the first dielectric layer;
      a second dielectric layer between the first conductor layer and the second conductor layer, and separating at least a portion of the second conductor layer from the first conductor layer; and
      a second isolator in the second conductor layer and surrounding a region of the second conductor layer, the region of the second conductor layer surrounded by the second isolator being isolated from other portions of the second conductor layer, and the second isolator extending through the second conductor layer to be connected to the first dielectric layer and the second dielectric layer.

8. The semiconductor device of claim 7, wherein the first isolator is aligned with the second isolator in the vertical direction.

9. The semiconductor device of claim 1, wherein the memory cell wafer further includes a plurality of gate conductor layers buried in the dielectric layer and extending horizontally.

10. The semiconductor device of claim 9, wherein:
   the plurality of gate conductor layers include a first gate conductor layer and a second gate conductor layer, the first gate conductor layer being farther away from the conductor layer than the second gate conductor layer, and the first gate conductor layer being shorter than the second gate conductor layer in the horizontal direction;
   the one or more through contacts are one or more first through contacts; and the memory cell wafer further includes a plurality of second through contacts each extending in the dielectric layer and contacting one of the plurality of gate conductor layers.

11. The semiconductor device of claim 9, wherein:

the memory cell wafer further includes a plurality of memory strings extending vertically through the dielectric layer;

each of the memory strings includes a channel hole filled a channel layer and a memory film surrounding the channel layer; and a portion of one of the gate conductor layers close to one of the channel holes and a corresponding portion of the channel layer and a corresponding portion of the memory film in the one of the channel holes form a memory cell in the corresponding memory string.

12. The semiconductor device of claim 1, wherein each of the one or more through contacts further includes an expansion part in the conductor layer, a lateral size of the expansion part being larger than a lateral size of the pad part.

13. The semiconductor device of claim 1, wherein:

the one or more through contacts include a plurality of through contacts; and the isolator surround the plurality of through contacts.

14. The semiconductor device of claim 1, wherein the memory cell wafer further includes a plurality of local insulation layers each surrounding and contacting the pad part of a corresponding one of the one or more through contacts.

15. A semiconductor device fabrication method comprising:

providing a starting wafer, the starting wafer including a substrate, a sacrificial layer formed over the substrate, and a conductor layer formed over the sacrificial layer;

patterning the conductor layer to form a trench in the conductor layer above the sacrificial layer, the trench isolating a region of the conductor layer surrounded by the trench from other portions of the conductor layer;

filling an insulation material in the trench to form an isolator;

forming memory structures in and over the conductor layer to form a memory cell wafer; and removing both the substrate and the sacrificial layer.

16. The method of claim 15, wherein the memory structures include:

a dielectric layer over the conductor layer;

one or more columns penetrating the dielectric layer; and one or more expansion parts in the conductor layer and each being in contact with one of the one or more columns.

17. The method of claim 16, wherein forming the memory structure includes:

forming the dielectric layer over the conductor layer;

patterning the dielectric layer by photolithography using a photoresist to form one or more vias in the dielectric layer, each of the one or more vias exposing a portion of the conductor layer;

removing the photoresist using a chemical, the chemical reaching a bottom of each of the one or more vias to etch the exposed portion of the conductor layer to form one or more voids in the conductor layer that are each in communication with one of the one or more vias, and a lateral size of each of the one or more voids being larger than a lateral size of a corresponding one of the one or more vias; and depositing a conductor material into the one or more voids and the one or more vias to form the one or more expansion parts and the one or more columns.

18. The method of claim 15, further comprising:

flipping and bonding the memory cell wafer to a control circuit wafer, followed by removing the substrate and the sacrificial layer.

19. The method of claim 18, further comprising:

depositing an insulation layer over the conductor layer;

patterning the insulation layer and the conductor layer to form one or more holes each exposing one of the one or more expansion parts, a lateral size of each of the one or more holes being smaller than a later size of a corresponding one of the one or more expansion parts; and depositing a conductor material in the one or more holes to form one or more pads.

20. A memory system comprising:

a memory device including:

a memory cell wafer including:

a dielectric layer;

a conductor layer over the dielectric layer;

one or more through contacts penetrating through the dielectric layer and the conductor layer, each of the one or more through contacts including:

a column part in the dielectric layer; and a pad part in the conductor layer; and an isolator in the conductor layer, the isolator surrounding a region of the conductor layer and at least one of the one or more through contacts in a horizontal direction and extending vertically through the conductor layer to be connected to the dielectric layer, and the region of the conductor layer surrounded by the isolator being isolated from other portions of the conductor layer; and a memory controller configured to control operation of the memory device.

* * * * *